United States Patent
Xiong et al.

(10) Patent No.: US 7,495,470 B2
(45) Date of Patent: Feb. 24, 2009

(54) NEGATIVE FEEDBACK CIRCUIT AND METHOD AND APPARATUS FOR IMPLEMENTING ON-CHIP IMPEDANCE MATCHING FOR TRANSMISSION LINE BY USING SAME

(75) Inventors: Tao Xiong, Guangdong (CN); Jun Xia, Guangdong (CN)

(73) Assignee: Huawei Technologies Co., Ltd, Guangdong (CN)

( * ) Notice: Subject to any disclaimer, the term of this patent is extended or adjusted under 35 U.S.C. 154(b) by 0 days.

(21) Appl. No.: 11/948,603

(22) Filed: Nov. 30, 2007

(65) Prior Publication Data

US 2008/0088387 A1    Apr. 17, 2008

Related U.S. Application Data

(63) Continuation of application No. PCT/CN2006/000709, filed on Apr. 18, 2006.

(30) Foreign Application Priority Data

Jun. 2, 2005    (CN) ........................ 2005 1 0035110

(51) Int. Cl.
H03K 17/16    (2006.01)
H03K 19/003    (2006.01)
(52) U.S. Cl. ............................. 326/30; 326/86; 327/109
(58) Field of Classification Search ................... 326/30, 326/82–83, 86; 327/108–109
See application file for complete search history.

(56) References Cited

U.S. PATENT DOCUMENTS

| 4,754,233 | A | 6/1988 | Pickett |
| 6,222,418 | B1 | 4/2001 | Gopinathan et al. |
| 6,731,164 | B2 * | 5/2004 | Johnston ........................ 330/85 |
| 6,836,142 | B2 * | 12/2004 | Lesea et al. .................... 326/30 |
| 6,980,020 | B2 * | 12/2005 | Best et al. ...................... 326/30 |
| 7,205,787 | B1 * | 4/2007 | Massoumi et al. ............. 326/30 |
| 2005/0253645 | A1 * | 11/2005 | North .......................... 327/543 |

FOREIGN PATENT DOCUMENTS

JP    05-152871 A    6/1993
JP    2001-267853 A    9/2001

* cited by examiner

*Primary Examiner*—Rexford Barnie
*Assistant Examiner*—Jason Crawford (57) ABSTRACT

A negative feedback circuit including: a voltage follower for making the output voltage follow a reference voltage, a proportional current mirror for outputting a current in proportion to a reference current via a reference resistor as a input current of the proportional current mirror, a comparison arbiter for comparing the voltage across the reference resistor and the voltage across a first variable resistor to acquire a regulating signal, inputting the regulating signal to the third regulating end of the first variable resistor and inputting the regulating signal to the third regulating end of a second variable resistor to synchronously regulate the resistances of the first and second variable resistors and thus make the resistances of the first and second variable resistors equal to the desired terminating resistance. The present invention also discloses a method and apparatus for performing on-chip impedance matching for a transmission line.

20 Claims, 6 Drawing Sheets

NEGATIVE FEEDBACK CIRCUIT AND METHOD AND APPARATUS FOR IMPLEMENTING ON-CHIP IMPEDANCE MATCHING FOR TRANSMISSION LINE BY USING SAME

FIELD OF THE TECHNOLOGY

The present invention relates to electronic circuit technologies, and particularly, to a negative feedback circuit, a method and an apparatus for implementing on-chip impedance matching for a transmission line.

BACKGROUND OF THE INVENTION

A transmission line is typically used for performing long distance transmission of signals. Impedance matching usually needs to be carried out on either of the sending side and the receiving side of a signal, in other words, make the equivalent impedance of the sending side or receiving side equal to the impedance of the transmission line, $Z_{TL}$, so as to avoid signal reflection. Such impedance matching is carried out on the receiving side more commonly and an ordinary method is to add a terminating resistor, $R_t$.

Figure 1:
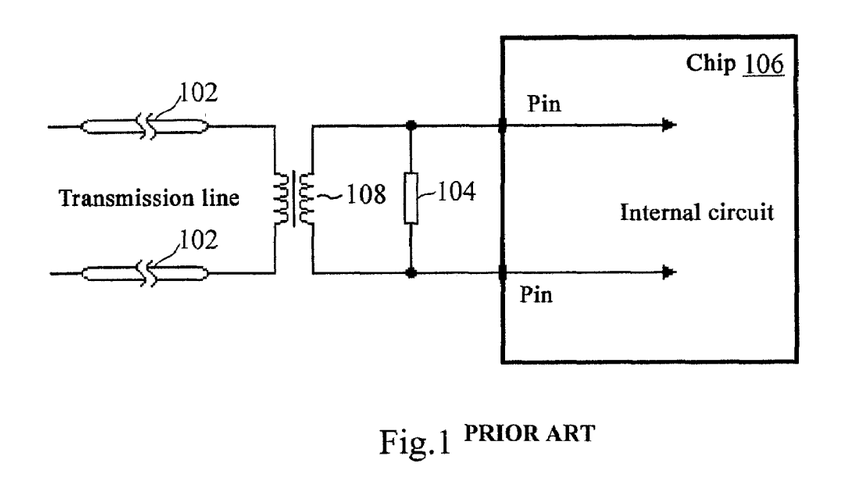
FIG. 1 shows a schematic diagram illustrating a circuit for performing impedance matching on the receiving side.

FIG. 1 shows a schematic diagram illustrating a circuit for implementing impedance matching on the receiving side of a transmission line. In FIG. 1, $Z_{TL}$ 102 is the impedance of the transmission line. After the impedance matching is performed by a terminating resistor $R_t$ 104 via the transmission line, a signal enters the internal circuit of chip 106 to be handled. In many practical applications (e.g. E1/T1), two transformers 108 are respectively connected on both sides of the transmission line for varying the amplitude of the signal and transforming the impedance. However, this does not substantially affect the principles and basic characteristics of the circuit. Transformer 108 on the receiving side is shown in FIG. 1. An off-chip discrete device with higher precision is typically adopted as $R_t$ 104 in practical applications since signal refection is sensitive to the degree of impedance matching.

This scheme has a disadvantage that the terminating resistor needs to be selected frequently from multiple terminating resistors by using a switch if the circuit is required to be compatible with transmission lines having different impedances. Multiple resistors in the practical product mean the increase of cost while the switch may bring a problem of low reliability and poor operability.

SUMMARY OF THE INVENTION

The present invention provides a negative feedback circuit and a method for implementing the negative feedback circuit, and an apparatus for performing on-chip impedance matching for a transmission line using the negative feedback circuit, so as to overcome at least one of the disadvantages in the prior art such as high cost, low reliability and poor operability.

The technical solutions in accordance with the present invention are achieved as follows.

A negative feedback circuit includes:

a reference resistor (302) having a first end and a second end, the second end of the reference resistor (302) being connected to a common end;

a first variable resistor (304) having a first end, a second end and a third regulating end, the second end of the first variable resistor (304) being connected to the common end;

a second variable resistor (306) having a first end, a second end and a third regulating end;

a voltage follower (308) having a first end, a second end and a third end, the first end of the voltage follower (308) being connected to the first end of the reference resistor (302) at node A; the voltage follower (308) being configured to make voltage at node A, $V_A$, follow a reference voltage inputted to the third end of the voltage follower (308);

a proportional current mirror (310) having an input end and an output end; the input end of the proportional current mirror (310) being connected to the second end of the voltage follower (308) and the output end of the proportional current mirror (310) being connected to the first end of the first variable resistor (304) at node B; the proportional current mirror (310) being configured to output a current of the output end of the proportional current mirror (310) in proportion to a current of the input end of the proportional current mirror (310); the current of the input end being a reference current via the reference resistor; and a comparison arbiter (312) having a first input end, a second input end, a first output end and a second output end, node A and node B being connected to a first input end and a second input end of the comparison arbiter (312), respectively; the comparison arbiter (312) being configured to compare the voltage at node A and the voltage at node B to acquire a regulating signal; the regulating signal being used for synchronously regulating the resistances of the first variable resistor (304) and the second variable resistor (306) so as to make the voltage at node B approach to the voltage at node A.

The comparison arbiter (312) includes:

a voltage comparator (330), a negative input end of the voltage comparator (330) acting as the first input end of the comparison arbiter (312) and a positive input end of the voltage comparator (330) acting as the second input end of the comparison arbiter (312); the voltage comparator (330) being configured to compare the voltage at node A, $V_A$, with the voltage at node B, $V_B$, and output the result of the comparison as an upward/downward counting control signal; and a reversible counter (336), an output end of the reversible counter (336) acting as the first output end of the comparison arbiter (312), the reversible counter (336) being configured to receive the upward/downward counting control signal output by the voltage comparator (330), count and output the result of the counting as the regulating signal.

A proportion of an offset voltage of the voltage comparator (330) to a reference voltage of the voltage comparator (330) is smaller than a desired error precision.

The comparison arbiter (312) further includes a code-stream sequential detector (334); an output end of the code-stream sequential detector (334) acts as the second output end of the comparison arbiter (312); and the code-stream sequential detector (334) is configured to output a holding signal when the upward/downward counting control signal is in a steady state; the steady state is a state of the upward/downward counting control signal when the voltage at node A, $V_A$, and the voltage at node B, $V_B$, are equal to each other continuously;

a holder (314) is connected between the comparison arbiter (312) and the second variable resistor (306); the holder (314) is configured to receive the holding signal, and hold the resistance of the second variable resistor (306) constant upon receiving the holding signal.

The code-stream sequential detector (334) includes: first, second, third and fourth triggers in series and other five triggers in series, and further includes first, second, third, fourth, fifth, sixth, seventh AND gates, an OR gate, and an inverter;

a positive output ends of the first, second, third triggers all are connected to an input end of the neighboring trigger of the next stage, and a negative output end of the first trigger, a positive output end of the second trigger, a negative output end of the third trigger, and a positive output end of the fourth trigger are connected to four input ends of the first AND gate, respectively; a positive output end of the first trigger, a negative output end of the second trigger, a positive output end of the third trigger, and a negative output end of the fourth trigger are connected to four input ends of the second AND gate, respectively; the negative output end of the first trigger, the negative output end of the second trigger, the positive output end of the third trigger, and the positive output end of the fourth trigger are connected to the four input ends of the third AND gate, respectively; the negative output end of the first trigger, the positive output end of the second trigger, the positive output end of the third trigger, and the negative output end of the fourth trigger are connected to the four input ends of the fourth AND gate, respectively; the positive output end of the first trigger, the positive output end of the second trigger, the negative output end of the third trigger, and the negative output end of the fourth trigger are connected to the four input ends of the fifth AND gate, respectively; the positive output end of the first trigger, the negative output end of the second trigger, the negative output end of the third trigger, and the positive output end of the fourth trigger are connected to the four input ends of the sixth AND gate, respectively;

the output ends of the above six AND gates are connected to six input ends of the OR gate, respectively, an output of the OR gate is connected to input ends of the five series triggers, and positive output ends of the five series triggers are connected to five input ends of the seventh AND gate, respectively;

the inverter is connected to each of the five series triggers and configured to invert a clock signal sent to the first, second, third and fourth triggers and send the inverted clock signal to each of the five series triggers.

A trigger connects the voltage comparator (330) and the reversible counter (336), and connects the voltage comparator (330) and the code-stream sequential detector (334), and the reversible counter (336) and the code-stream sequential detector (334) receive the upward/downward counting control signal via the trigger.

A criterion based on which the code-stream sequential detector (334) determines that the upward/downward counting control signal is in a steady state is that: the code stream of the upward/downward counting control signal in the steady state appears for odd times continuously.

The holder (314) is a register.

The first variable resistor (304) and the second variable resistor (306) are composed of multiple parallel resistors as a parallel structure, respectively, and each branch of the parallel structure respectively composing the first variable resistor (304) and the second variable resistor (306) includes a switch and a resistor.

The multiple resistors are the same multiple resistors with the resistance of R.

The regulable resistances of the first variable resistor (304) and the second variable resistor (306) are R/n (n=0, 1, 2, ..., $2^{N-1}$), n is the number of the multiple parallel resistors, and N is a positive integer.

The branch is a branch formed by grouping according to binary weight.

The switch is formed by using an NMOS transistor or PMOS transistor, and the resistor in the parallel structure includes a first resistor and a second resistor; and a method for connecting the switch and the resistor in the parallel structure includes: a source and a drain of the NMOS transistor or PMOS transistor are connected to the first resistor and the second resistor in series, respectively.

The first variable resistor (304) and the second variable resistor (306) are composed of multiple series resistors, respectively.

The second end of the reference resistor (302) is grounded; the second end of the first variable resistor (304) is grounded; the second variable resistor (306) as a terminating resistor is a resistor identical with the first variable resistor (304).

A method for performing on-chip impedance matching for a transmission line on the basis of the negative feedback circuit includes:

comparing voltage across a reference resistor with voltage across a first variable resistor, and acquiring a regulating signal according to the result of the comparison;

synchronously regulating the resistances of the first variable resistor and a second variable resistor to make the resistance of the second variable resistor equal to the desired terminating resistance.

The acquiring a regulating signal according to the result of the comparison includes:

outputting a high level when the voltage across the first variable resistor is larger than the voltage across the reference resistor and outputting a low level when the voltage across the first variable resistor is smaller than the voltage across the reference resistor;

counting according to the outputted high level and low level and taking the result of the counting as the regulating signal; and upward counting is performed when the high level is output while downward counting is performed when the low level is output.

The synchronously regulating the resistances of the first variable resistor and a second variable resistor to make the resistance of the second variable resistor equal to the desired terminating resistance includes:

feeding back the regulating signal to a regulating end of the first variable resistor and a regulating end of the second variable resistor to synchronously regulate the resistances of the first variable resistor and the second variable resistor.

The method further includes: holding the resistance of the second variable resistor when the voltage across the reference resistor and the voltage across the first variable resistor are equal to each other continuously.

An apparatus for performing on-chip impedance matching for a transmission line includes the negative feedback circuit.

The variable resistor implemented in accordance with the present invention may act as a terminating resistor individually, or may be in parallel with an external precise resistor and act as a terminating resistor together with an external precise resistor.

It is obvious that the negative feedback circuit and the method for implementing the negative feedback circuit, and an apparatus for performing on-chip impedance matching for a transmission line using the negative feedback circuit all cost less than that of the conventional scheme. Moreover, it is more convenient and flexible to accomplish impedance matching without the frequent use of a switch. Therefore, high reliability and good operability are achieved.

BRIEF DESCRIPTION OF THE DRAWINGS

The present invention is described in an exemplifying manner with reference to the accompanying drawings.

EMBODIMENTS OF THE INVENTION

Embodiments of the present invention are hereinafter described with reference to the accompanying drawings as follows.

Figure 2A:
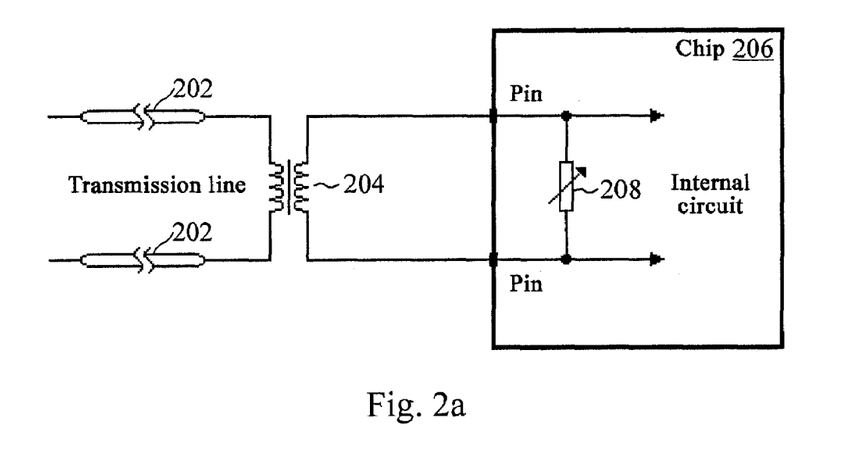
FIG. 2a shows a schematic diagram illustrating a circuit for performing impedance matching by directly using a negative feedback circuit on the receiving side in accordance with the present invention.
Figure 2B:
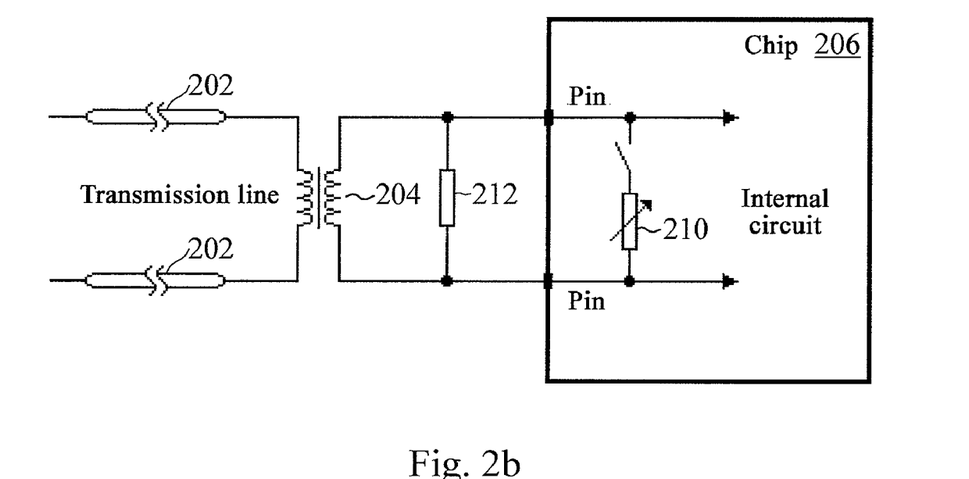
FIG. 2b shows a schematic diagram illustrating a circuit for performing impedance matching by using an external resistor and a negative feedback circuit on the receiving side in accordance with the present invention.

FIGS. 2a and 2b show a schematic diagram illustrating a circuit for performing impedance matching without an external resistor on the receiving side in accordance with the present invention and a schematic diagram illustrating a circuit for performing impedance matching using an external resistor on the receiving side in accordance with the present invention, respectively. It is shown in FIG. 2a that a negative feedback circuit is used for performing impedance matching for a transmission line in accordance with the present invention. It is shown in FIG. 2b that a negative feedback circuit and an external resistor are jointly used for performing impedance matching for the transmission line in accordance with the present invention. $Z_{TL}$ 202 is the impedance of the transmission line, and two transformers 204 for varying the amplitude of a signal and transforming the impedance are connected to both sides of the transmission line, respectively. As shown in FIGS. 2a and 2b, the variable resistor, $R_t$ 208, is a resistor matching with the impedance of the transmission line in real-time chip 206 in accordance with the present invention. $R_p$ 210 is a resistor matching with the impedance of the transmission line in real time chip 206 in accordance with the present invention. $R_s$ 212 is an external resistor in parallel with a negative feedback circuit in accordance with the present invention. A match resistor is obtained by adding a parallel negative feedback circuit to enable the input impedance of the load end to be matched with the characteristic impedance of the transmission line, so as to avoid the reflection on the load end.

Figure 3:
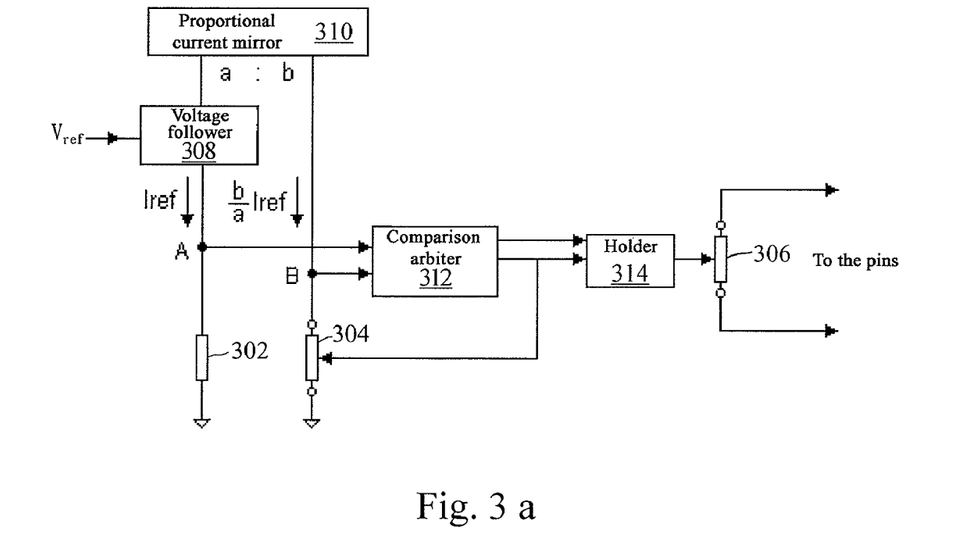
FIG. 3a shows a schematic diagram illustrating a structure of a negative feedback circuit in accordance with the present invention.
FIG. 3b shows a schematic circuit diagram of a negative feedback circuit in accordance with the present invention.

FIG. 3a shows a schematic diagram illustrating a negative feedback circuit in accordance with the present invention. The negative feedback circuit includes:

reference resistor 302 having a first end and a second end which is grounded;

first variable resistor 304 having a first end, a second end which is grounded, and a third regulating end;

second variable resistor 306, which is the same as first variable resistor 304, having a first end, a second end, and a third regulating end;

voltage follower 308 having a first end, a second end and a third end, the first end of voltage follower 308 being connected to the first end of reference resistor 302 at connection node A, voltage follower 308 being used together with reference resistor 302 for generating a reference current, $I_{ref}$, the voltage at node A being $V_A$, and a reference voltage, $V_{ref}$, being input to the third end of voltage follower 308;

proportional current mirror 310 having an input end and an output end, the proportion of an input current to an output current of proportional current mirror 310 being a:b, the input end being connected to the second end of voltage follower 308, the output end of the proportional current mirror 310 being connected to the first end of first variable resistor 304 and the connection node being B, the generated current being $$\frac{b}{a}I_{ref},$$

and the voltage at node B being $V_B$;

comparison arbiter 312 having a first input end, a second input end, a first output end and a second output end, the voltage at node A, $V_A$, and the voltage at node B, $V_B$, being respectively input to the first and second input ends and thus comparison arbiter 312 acquiring a regulating signal and feeding the regulating signal back from its first output end to the third regulating end of first variable resistor 304 to regulate the resistance of first variable resistor 304, the regulating signal been inputted to the third regulating end of second variable resistor 306 to regulate the resistances of first variable resistor 304 and second variable resistor 306 synchronously so as to make the resistance of second variable resistor 306 equal to the desired terminating resistance.

Comparison arbiter 312 may further input the regulating signal to the third regulating end of second variable resistor 306 via holder 314. Holder 314 has a first input end, a second input end and an output end. When the voltage at node A, $V_A$, and the voltage at node B, $V_B$, are equal to each other continuously, comparison arbiter 312 acquires a holding signal and outputs the holding signal to holder 314, and then holder 314 holds the resistance of second variable resistor 306 constant.

Figure 3B:
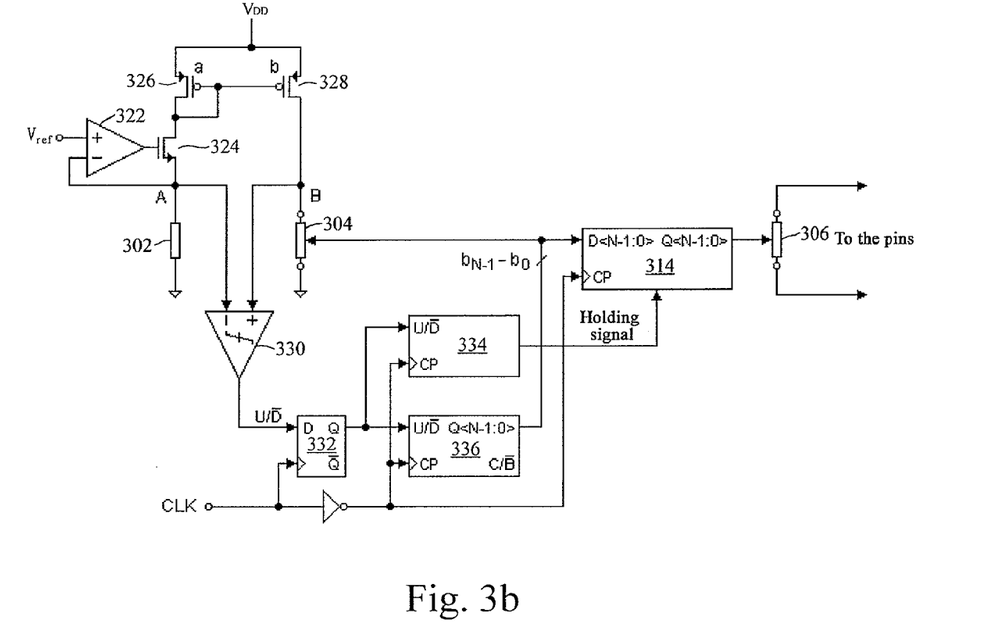

FIG. 3b shows a schematic circuit diagram of a negative feedback circuit in accordance with the present invention. Amplifier 322 and first transistor 324 in FIG. 3b compose voltage follower 308 in FIG. 3a. First transistor 324 is an NMOS transistor having a source, a drain and a gate. The output end of amplifier 322 is connected to the gate of first transistor 324. The positive input end of the amplifier 322 acts as the third end of voltage follower 308 and the reference voltage, $V_{ref}$, is input to the positive input end. The negative input end of amplifier 322 is connected to the source of first transistor 324 and the connection end acts as the first end of voltage follower 308. The drain of first transistor 324 acts as the second end of voltage follower 308.

Second transistor 326 and third transistor 328 in FIG. 3b compose proportional current mirror 310 in FIG. 3a. Second transistor 326 and third transistor 328 are PMOS transistors having a source, a drain and a gate. The source of second transistor 326 is connected to the source of the third transistor 328 and connected to the power supply. The gate of second transistor 326 is connected to the gate of third transistor 328. The drain of second transistor 326 is connected to the gate of second transistor 326 and acts as the input of proportional current mirror 310. The drain of the third transistor acts as the output end of proportional current mirror 310.

In practical applications, first transistor 324, second transistor 326 and third transistor 328 all may be selected from the group consisting of a junction field effect transistor, a MOS transistor, and a bipolar transistor. The connection structure may vary depending on the different adopted transistors. However, the same function may be achieved.

Voltage comparator 330, trigger 332, code-stream sequential detector 334 and reversible counter 336 in FIG. 3b compose comparison arbiter 312 in FIG. 3a. Voltage comparator 330 is used for comparing the voltage at node A, $V_A$, with the voltage at node B, $V_B$. The negative input end of voltage comparator 330 acts as the first input end of comparison arbiter 312 while the positive input end of voltage comparator 330 acts as the second input end of comparison arbiter 312. The proportion of the offset voltage of voltage comparator 330 to the reference voltage of voltage comparator 330 is smaller than the desired error precision of match resistor. The output end of voltage comparator 330 outputs the result of comparison as a control signal to code-stream sequential detector 334 and reversible counter 336 via trigger 332. The output end of reversible counter 336 acts as the first output end of comparison arbiter 312. The output end of code-stream sequential detector 334 acts as the second output end of comparison arbiter 312. The clock signal input to code-stream sequential detector 334 and the reversible counter 336 is an inverted phase clock signal of the clock signal input to trigger 332. Moreover, the used clock signal is a continuous pulse signal. Holder 314 is a register. Trigger 332 is a D trigger. Other triggers capable of implementing the same function may also be selected and the same effect may be achieved. An apparatus with the negative feedback structure accomplishes comparison, counting and resistance regulating once a clock period.

It is obvious that $R_1=R_{ref} \times a/b$ when the voltage at node B, $V_B$, is equal to the voltage at node A, $V_A$. Moreover, the resistance of first variable resistor 304 is $R_1$ and the resistance of the reference resistor is $R_{ref}$. Therefore, the resistance of first variable resistor 304 may be made equal to the desired terminating resistance by selecting the appropriate values of $R_{ref}$, a, and b.

The output level of voltage comparator 330 as an upward/downward counting control signal is input to reversible counter 336 via the trigger 332. When the voltage $V_B$, is larger than the voltage $V_A$, voltage comparator 330 outputs a high level, which indicates that the resistances of first variable resistor 304 and second variable resistor 306 are larger than the desired resistances, so that the reversible counter 336 performs upward counting and feeds the result of the counting as a regulating signal to the third regulating end of first variable resistor 304 and outputs the result of the counting as the regulating signal to the third regulating end of second variable resistor 306 via holder 314, which enables the resistances of first variable resistor 304 and second variable resistor 306 to be decreased. When the voltage $V_B$ is smaller than the voltage $V_A$, the voltage comparator 330 outputs a low level, which indicates that the resistances of first variable resistor 304 and second variable resistor 306 are smaller than the desired resistances, so that reversible counter 336 performs upward counting and feeds the result of the counting as a regulating signal to the third regulating end of first variable resistor 304 and outputs the result of the counting as the regulating signal to the third regulating end of second variable resistor 306 via holder 314, which enables the resistances of first variable resistor 304 and second variable resistor 306 to be increased.

Code-stream sequential detector 334 takes it as a steady state determining criterion that the code stream of the control signal in steady state appears for odd times continuously. After the state of the code stream is steady, code-stream sequential detector 334 outputs a holding signal to holder 314 to make holder 314 enter a holding state. Therefore, the resistance of second variable resistor 306 is held constant.

The input offset voltage of voltage comparator 330 is an importance error source in the present invention, and thus it needs to be ensured in practical design that the proportion of the offset voltage of voltage comparator 330 to the reference voltage of voltage comparator 330 is smaller than the desired error precision of match resistance. Supposing that the offset voltage is 10 mV and the desired error precision of match resistance does not exceed 1%, the reference voltage must be set at least as 1V. Taking the error due to discontinuous resistances into consideration, the requirement should be stricter. In fact, there is an input offset voltage of voltage follower 308, and the true reference voltage is the voltage at node A, $V_A$, from the viewpoint of the principle. Therefore, it only needs to be ensured that the reference voltage minus the offset voltage may still meet the above demand. In the above example, supposing that the offset voltage of voltage follower 308 is 10 mV, the reference voltage only needs to exceed than 1.01 V, which is easy to be met, and therefore it is not necessary to take the influence of this factor into account.

Figure 4:
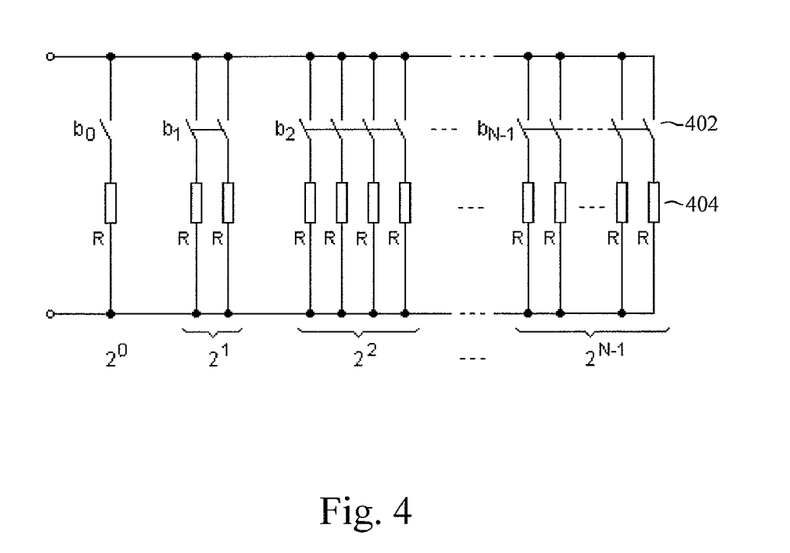
FIG. 4 shows a schematic circuit diagram of a first variable resistor and a second variable resistor in accordance with the present invention.

FIG. 4 shows a schematic circuit diagram of first variable resistor 304 and second variable resistor 306 in accordance with the present invention. First variable resistor 304 and second variable resistor 306 are composed of multiple parallel resistors with the same resistance. The resistances of multiple resistors 404 all are R. Each branch in the parallel structure includes switch 402 and resistor 404, and is grouped according to binary weight and controlled by a corresponding switch. If the control bit is 1, it is denoted that the switch 402 is closed. The switch control bits are sorted according to the number of the resistors corresponding to the switch control bits, and thus a binary control code, $b_{N-1} \ldots b_2 b_1 b_0$, is acquired. The value of the binary control code denotes the number of the parallel resistors. Therefore, the regulable resistances of first variable resistor 304 and second variable resistor 306 are R/n (n=0, 1, 2, ..., $2^N-1$). The resistance of resistors 404 with the same resistance and the value of N may be selected appropriately according to the desired precision of impedance matching.

First variable resistor 304 and second variable resistor 306 may also be composed of multiple series resistors with the same resistance so as to reduce the static operation current of the whole circuit. Supposing that the resistances of the multiple resistors with the same resistance are R and there are k series resistors with the same value, the corresponding proportion of the input current of proportional current mirror 310 to the output current of proportional current mirror 310 should be changed into a:(b/k) so as to ensure that the eventual match resistance will not be changed. Only the proportion of proportional current mirror 310 needs to be changed by configuring a register on the chip when the match resistance is to be changed.

Figure 5:
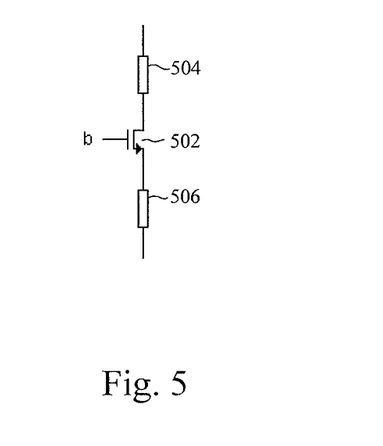
FIG. 5 shows a schematic circuit diagram of a connection structure of a switch and a resistor in the structure of the variable resistor shown in FIG. 4.

FIG. 5 shows a schematic circuit diagram of the connection structure of switch 402 and resistor 404 in the structure of the variable resistor shown in FIG. 4. The switch in the structure of the variable resistor may be implemented with an NMOS transistor. The operation states of first variable resistor 304 and second variable resistor 306 are different from each other, and therefore the influence of the operation states (including the working voltage of source, drain and substrate) on the on-resistances of their respective NMOS transistor switches 502 are different, which results in an impedance matching error. The method for reducing the impedance matching error is to reduce the on-resistance of NMOS transistor switch 502 and the proportion of the on-resistance to the resistance R. In order to make the variation ranges of the on-resistances of the switches small as much as possible when first variable resistor 304 and second variable resistor 306 operate under a differential voltage signal, resistor 404 generally includes resistor 504 and resistor 506 in FIG. 5, and accordingly the method for connecting NMOS transistor switch 502 and resistor 404 includes: connecting the source and the drain of NMOS transistor switch 502 to resistor 504 and resistor 506 with the resistance of R/2 in series, respectively. The corresponding relation between a binary code and a resistance will be changed if PMOS transistors are adopted, and the binary code corresponding to the resistance is the result of NOT operation for the original binary code.

In general, resistor 504 may be called a first resistor and resistor 506 may be called a second resistor.

Figure 6A:
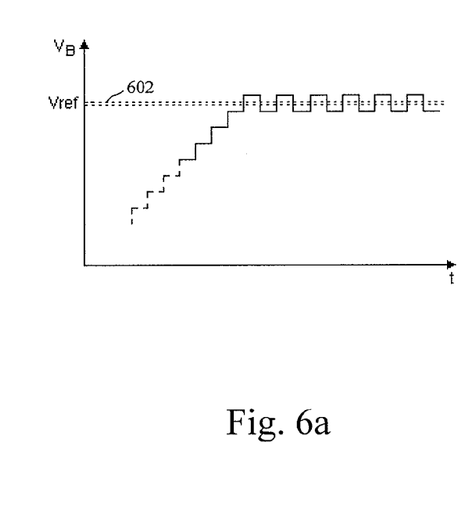
FIG. 6a shows a schematic diagram illustrating a control signal corresponding to a steady state is a continuous code of "1010" in accordance with the present invention.
Figure 6B:
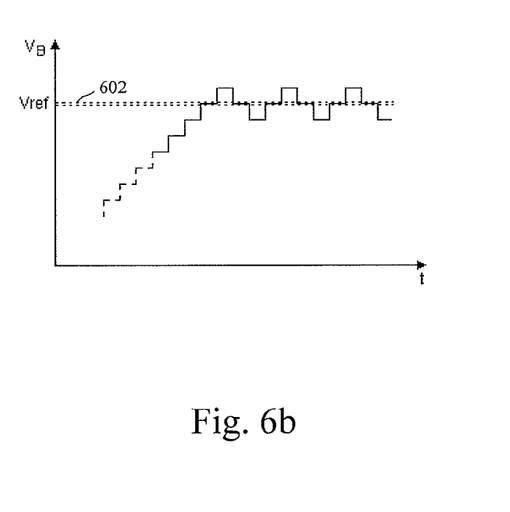
FIG. 6b shows a schematic diagram illustrating that a control signal corresponding to a steady state is a continuous code of "1100" in accordance with the present invention.

FIGS. 6a and 6b show a schematic diagram illustrating that a control signal corresponding to a steady state is a continuous code of "1010" and "1100", respectively. It is difficult for the voltage at node A, $V_A$, and the voltage at node B, $V_B$, to be exactly equal to each other, since first variable resistor 304 is regulated discontinuously. Moreover, the limitation of the performance of voltage comparator 330 should also be taken into consideration, and the resistance of first variable resistor 304 will not be held at the design value all along but will fluctuate slightly around a design value. The corresponding voltage at node B, $V_B$, is shown in FIGS. 6a and 6b. The dead zone in FIGS. 6a and 6b is raised by the limitation of the performance of voltage comparator 330. If the input signal falls in this zone, voltage comparator 330 cannot make a judgment in time and the output will be held in the state of the previous moment.

When the voltage, $V_B$, corresponding to the resistance of first variable resistor 304 does not fall in the dead zone 602, the node voltage waveform corresponding to the continuous operation of the circuit is shown in FIG. 6a, and the upward/downward counting control signal (U/$\overline{D}$ control signal) corresponding to the steady state is a continuous code of "1010". When the voltage, $V_B$, corresponding to the resistance of first variable resistor 304 falls in the dead zone 602, the voltage waveform at the node corresponding to the continuous operation of the circuit is shown in FIG. 6b, and the U/$\overline{D}$ control signal corresponding to the steady state is a continuous code of "1100". Of course, six codes, "1010", "0101", "1100", "0110", "0011", "1001", corresponding to the two codes in FIG. 6, may occur due to different pickup positions.

As can be seen from the above, that U/$\overline{D}$ control signal is a continuous code of "1100" may be used for a criterion for determining that the circuit reaches the eventual steady state. The code-stream sequential detector 334 detects the U/$\overline{D}$ control signal, and it is considered that the state is already steady when the above code appears continuously. Moreover, in order to reduce an error as much as possible, it is appropriate to adopt the repetition of the code for odd times in the determining criterion. In general, code-stream sequential detector 334 takes it as the steady state determining criterion that the code stream of the U/$\overline{D}$ control signal in steady state appears for 5 times continuously.

In order that second variable resistor 306 as a terminating resistor will not vary after the state is steady, holder 314 with a holding function is added between the output of reversible counter 336 and second variable resistor 306. When determining that the state of the circuit is steady, the code-stream sequential detector 334 outputs a holding signal (Hold) to make holder 314 be in a holding state. Thus, the resistance of second variable resistor 306 will not vary. Second variable resistor 306 performs the same variation as that of first variable resistor 304 again only when the circuit quits the steady state.

Figure 7:
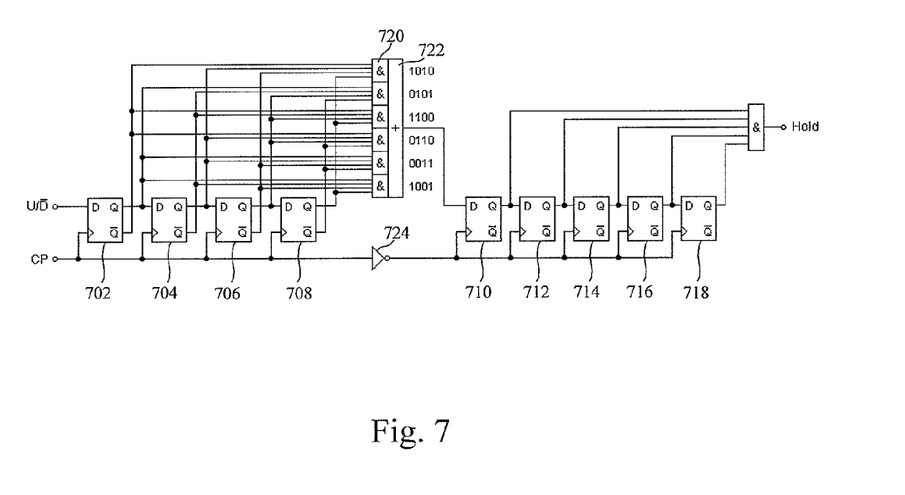
FIG. 7 shows a schematic circuit diagram of a code-stream sequential detector in accordance with the present invention.

FIG. 7 shows a schematic circuit diagram of the code-stream sequential detector in accordance with the present invention. Code-stream sequential detector 334 includes: triggers (702, 704, 706, 708, 710, 712, 714, 716, 718), an AND gate 720, an OR gate 722 and an inverter 724. AND gate 720 includes six identical AND gates, a first AND gate, a second AND gate, a third AND gate, a fourth AND gate, a fifth AND gate and a sixth AND gate. The connection relation between devices in FIG. 7 includes:

connecting first trigger 702, second trigger 704, third trigger 706 and fourth trigger 708 in series, the positive output ends of the triggers except for fourth trigger 708 all being connected to the input end of the neighboring trigger of the next stage, and connecting the negative output end of first trigger 702, the positive output end of second trigger 704, the negative output end of third trigger 706 and the positive output end of fourth trigger 708 to the four input ends of the first AND gate, respectively; connecting the positive output end of first trigger 702, the negative output end of second trigger 704, the positive output end of third trigger 706, and the negative output end of fourth trigger 708 to the four input ends of the second AND gate, respectively; connecting the negative output end of first trigger 702, the negative output end of second trigger 704, the positive output end of third trigger 706, and the positive output end of fourth trigger 708 to the four input ends of the third AND gate, respectively; connecting the negative output end of first trigger 702, the positive output end of second trigger 704, the positive output end of third trigger 706, and the negative output end of fourth trigger 708 to the four input ends of the fourth AND gate, respectively; connecting the positive output end of first trigger 702, the positive output end of second trigger 704, the negative output end of third trigger 706, and the negative output end of fourth trigger 708 to the four input ends of the fifth AND gate, respectively; connecting the positive output end of first trigger 702, the negative output end of second trigger 704, the negative output end of third trigger 706, and the positive output end of fourth trigger 708 to the four input ends of the sixth AND gate, respectively;

connecting the output ends of the above six AND gates to the six input ends of an OR gate, and connecting the output end of the OR gate to the input end of five series triggers similar to the above four series triggers, the clock signal input to the five series triggers being the clock signal acquired by inverting the clock signal input to the above four series triggers by an inverter. In addition, the five series triggers correspond to triggers 710, 712, 714, 716 and 718 in FIG. 7, respectively, and the positive output end of each of the five triggers is connected to one of the five input ends of an AND gate so as to ensure that the output of the AND gate is a holding signal.

As can be seen from the above, the operation performed by the devices in FIG. 7 on the basis of the above connection relation includes: in a clock period, performing an AND operation for the negative output end of first trigger 702, the positive output end of second trigger 704, the negative output end of third trigger 706 and the positive output end of the fourth trigger 708, performing AND operation for the positive output end of first trigger 702, the negative output end of second trigger 704, the positive output end of third trigger 706 and the negative output end of fourth trigger 708, performing AND operation for the negative output end of first trigger 702, the negative output end of second trigger 704, the positive output end of third trigger 706 and the positive output end of fourth trigger 708, performing AND operation for the negative output end of first trigger 702, the positive output end of second trigger 704, the positive output end of the third trigger 706 and the negative output end of the fourth trigger 708, performing AND operation for the positive output end of first trigger 702, the positive output end of second trigger 704, the negative output end of third trigger 706 and the negative output end of fourth trigger 708, performing AND operation for the positive output end of first trigger 702, the negative output end of the second trigger 704, the negative output end of third trigger 706 and the positive output end of fourth trigger 708.

Perform an OR operation for the six results of the above AND operations, input the result of the OR operation to the five series triggers (710, 712, 714, 716, 718) so as to perform an AND operation for the positive outputs of the five series triggers and thus acquire a holding signal (Hold) eventually. The clock signal for the five series triggers is an inverted clock signal of the clock signal input to the four series triggers (702, 704, 706, 708).

Figure 8:
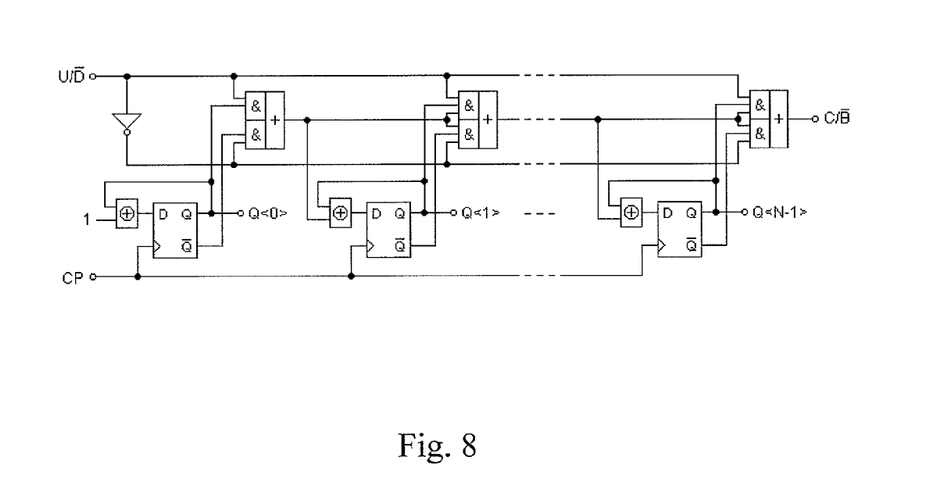
FIG. 8 shows a schematic circuit diagram of a reversible counter in accordance with the present invention.

FIG. 8 shows a schematic circuit diagram of a reversible counter in accordance with the present invention. Reversible counter 336 is composed of multiple D triggers, multiple AND gates, multiple OR gates and multiple NOR gates and has a control signal input end, a clock input end, a carry/borrow output end C/$\overline{B}$ and an N-bit counting output end. Since the number of the bits of the output end of reversible counter 336 is equal to the number of the bits of the regulating input end of first variable resistor 304, there is no carry or borrow in the counting process. Thus, the carry/borrow output end C/$\overline{B}$ may be omitted in fact. Other multiple reversible counters capable of implementing the same function may also be used.

Figure 9:
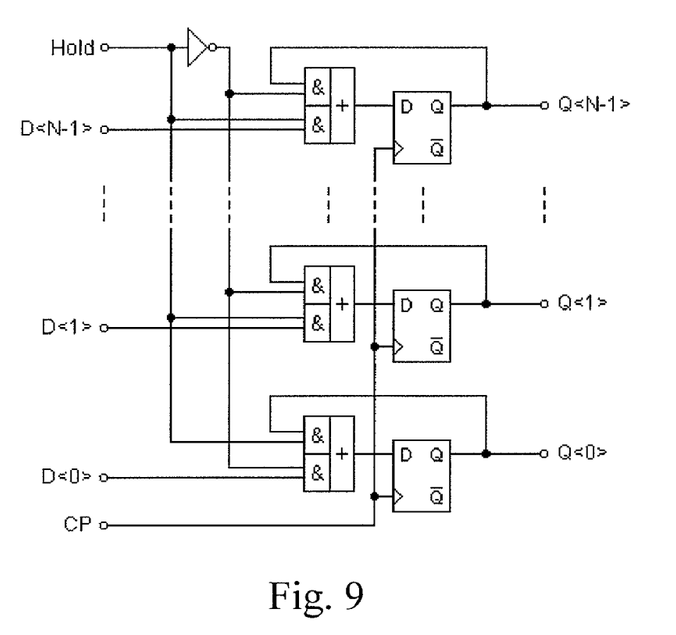
FIG. 9 shows a schematic circuit diagram of a holder with a holding function in accordance with the present invention.

FIG. 9 shows a schematic circuit diagram of a holder with a holding function in accordance with the present invention. The holder is a register and composed of N D triggers, 2N AND gates and N OR gates. As shown in FIG. 9, an AND OR operation are performed on a holding signal and the N-bit parallel inputs, and N-bit parallel outputs are acquired via N triggers. Other multiple types of reversible registers capable of implementing the same function may also be used.

In addition, multiple amplifiers and voltage comparators capable of implementing the same function may be adopted as the amplifier and voltage comparator used in the present invention.

Figure 10:
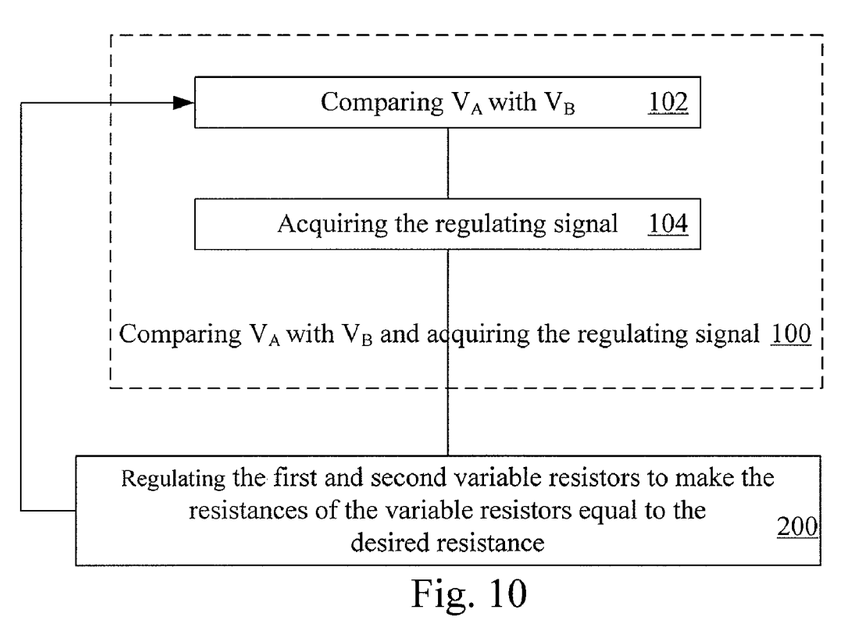
FIG. 10 shows a flow chart of a method for performing on-chip impedance matching for a transmission line using a negative feedback circuit in accordance with the present invention.

FIG. 10 shows a flow chart of a method for performing on-chip impedance matching for a transmission line using a negative feedback circuit in accordance with the present invention. Since the specific method for performing on-chip impedance matching for the transmission line using the negative feedback circuit has been described in detail in FIGS. 2 to 9, the method for performing the on-chip impedance matching for the transmission line using the negative feedback circuit is only described in brief in FIG. 10. The method shown in FIG. 10 includes the following steps.

In step 100, a comparison arbiter compares the voltage across a reference resistor with the voltage across a first variable resistor and acquires a regulating signal.

In step 200, the negative feedback circuit feeds back the regulating signal to the first variable resistor to regulate the first variable resistor and synchronously regulates the resistance of the second variable resistor, thereby accomplishing the impedance matching.

$R_1 = R_{ref} \times a/b$ when $V_B = V_A$. Moreover, the resistance of the reference resistor is $R_{ref}$ and the resistance of the first variable resistor is $R_1$. Therefore, the resistance of the first variable resistor acquired through the calculation may be equal to the desired terminating resistance by selecting appropriate $R_{ref}$, a and b according to the above conditions. An off-chip precise resistor is adopted as the reference resistor and the resistance of the reference resistor is very large.

Specifically, the operation performed by the comparison arbiter in step 100 includes the following steps.

In step 102, the voltage comparator compares the voltage at node A with the voltage at node B and takes the result of the comparison as an upward/downward counting control signal for the reversible counter. Specifically, when the voltage, $V_B$, is larger than the voltage, $V_A$, the voltage comparator outputs a high level, which indicates that the resistance of the first variable resistor is larger than the desired terminating resistance; when the voltage, $V_B$, is smaller than the voltage, $V_A$, the voltage comparator outputs a low level, which indicates that the resistance of the first variable resistor is smaller than the desired terminating resistance In step 104, a counter performs upward counting if the upward/downward counting control signal is a high level, performs downward counting if the upward/downward counting control signal is a low level, and the result of the counting acts as the regulating signal.

Specifically, in step 200, the regulating signal output by the comparison arbiter is fed back to the third regulating end of the first variable resistor and is input to the third regulating end of the second variable resistor via the holder, the first variable resistor and the second variable resistor are regulated synchronously so as to make the resistances of the first variable resistor and the second variable resistor equal to the desired terminating resistance, and the comparison arbiter outputs a holding signal when $V_B$ and $V_A$ are equal to each other continuously to make the holder be in a holding state, which makes the second variable resistor constant.

The above multiple steps are completed in one clock period and each of the steps is performed according to an input clock pulse signal. The clock pulse signal is a continuous pulse signal.

The present invention also involves an apparatus for performing on-chip impedance matching for a transmission line using a negative feedback circuit. The negative feedback circuit is set in the apparatus and thus the object of real-time on-chip impedance matching for a transmission line may be achieved.

As can be seen from the above, the negative feedback circuit and the method for implementing the negative feedback circuit, and the apparatus for performing on-chip impedance matching for a transmission line using the negative feedback circuit all cost less than that of the conventional scheme. Moreover, it is more convenient and flexible to achieve impedance matching without frequent uses of a switch. Thus, high reliability and good operability are attained.

The invention claimed is:

1. A negative feedback circuit, comprising:
   a reference resistor (302) having a first end and a second end, the second end of the reference resistor (302) being connected to a common end;
   a first variable resistor (304) having a first end, a second end and a third regulating end, the second end of the first variable resistor (304) being connected to the common end;
   a second variable resistor (306) having a first end, a second end and a third regulating end;
   a voltage follower (308) having a first end, a second end and a third end, the first end of the voltage follower (308) being connected to the first end of the reference resistor (302) at node A; the voltage follower (308) being configured to make voltage at node A, VA, follow a reference voltage inputted to the third end of the voltage follower (308);
   a proportional current mirror (310) having an input end and an output end; the input end of the proportional current mirror (310) being connected to the second end of the voltage follower (308) and the output end of the proportional current mirror (310) being connected to the first end of the first variable resistor (304) at node B; the proportional current mirror (310) being configured to output a current of the output end of the proportional current mirror (310) in proportion to a current of the input end of the proportional current mirror (310); the current of the input end being a reference current via the reference resistor; and
   a comparison arbiter (312) having a first input end, a second input end, a first output end and a second output end, node A and node B being connected to a first input end and a second input end of the comparison arbiter (312), respectively; the comparison arbiter (312) being configured to compare the voltage at node A and the voltage at node B to acquire a regulating signal; the regulating signal being used for synchronously regulating the resistances of the first variable resistor (304) and the second variable resistor (306) so as to make the voltage at node B approach to the voltage at node A.

2. The circuit of claim 1, wherein the comparison arbiter (312) comprises:
   a voltage comparator (330), a negative input end of the voltage comparator (330) acting as the first input end of the comparison arbiter (312) and a positive input end of the voltage comparator (330) acting as the second input end of the comparison arbiter (312); the voltage comparator (330) being configured to compare the voltage at node A, VA, with the voltage at node B, VB, and output the result of the comparison as an upward/downward counting control signal; and
   a reversible counter (336), an output end of the reversible counter (336) acting as the first output end of the comparison arbiter (312), the reversible counter (336) being configured to receive the upward/downward counting control signal output by the voltage comparator (330), count and output the result of the counting as the regulating signal.

3. The circuit of claim 2, wherein a proportion of an offset voltage of the voltage comparator (330) to a reference voltage of the voltage comparator (330) is smaller than a desired error precision.

4. The circuit of claim 2, wherein the comparison arbiter (312) further comprises a code-stream sequential detector (334); an output end of the code-stream sequential detector (334) acts as the second output end of the comparison arbiter (312); and the code-stream sequential detector (334) is configured to output a holding signal when the upward/downward counting control signal is in a steady state; the steady state is a state of the upward/downward counting control signal when the voltage at node A, VA, and the voltage at node B, VB, are equal to each other continuously;
   a holder (314) is connected between the comparison arbiter (312) and the second variable resistor (306); the holder (314) is configured to receive the holding signal, and hold the resistance of the second variable resistor (306) constant upon receiving the holding signal.

5. The circuit of claim 4, wherein the code-stream sequential detector (334) comprises: first, second, third and fourth triggers in series and other five triggers in series, and further comprises first, second, third, fourth, fifth, sixth, seventh AND gates, an OR gate, and an inverter;
   a positive output ends of the first, second, third triggers all are connected to an input end of the neighboring trigger of the next stage, and a negative output end of the first trigger, a positive output end of the second trigger, a negative output end of the third trigger, and a positive output end of the fourth trigger are connected to four input ends of the first AND gate, respectively; a positive output end of the first trigger, a negative output end of the second trigger, a positive output end of the third trigger, and a negative output end of the fourth trigger are connected to four input ends of the second AND gate, respectively; the negative output end of the first trigger, the negative output end of the second trigger, the positive output end of the third trigger, and the positive output end of the fourth trigger are connected to the four input ends of the third AND gate, respectively; the negative output end of the first trigger, the positive output end of the second trigger, the positive output end of the third trigger, and the negative output end of the fourth trigger are connected to the four input ends of the fourth AND gate, respectively; the positive output end of the first trigger, the positive output end of the second trigger, the negative output end of the third trigger, and the negative output end of the fourth trigger are connected to the four input ends of the fifth AND gate, respectively; the positive output end of the first trigger, the negative output end of the second trigger, the negative output end of the third trigger, and the positive output end of the fourth trigger are connected to the four input ends of the sixth AND gate, respectively;
   the output ends of the above six AND gates are connected to six input ends of the OR gate, respectively, an output of the OR gate is connected to input ends of the five series triggers, and positive output ends of the five series triggers are connected to five input ends of the seventh AND gate, respectively;
   the inverter is connected to each of the five series triggers and configured to invert a clock signal sent to the first, second, third and fourth triggers and send the inverted clock signal to each of the five series triggers.

6. The circuit of claim 4, wherein a trigger connects the voltage comparator (330) and the reversible counter (336), and connects the voltage comparator (330) and the code-stream sequential detector (334), and the reversible counter (336) and the code-stream sequential detector (334) receive the upward/downward counting control signal via the trigger.

7. The circuit of claim 4, wherein a criterion based on which the code-stream sequential detector (334) determines that the upward/downward counting control signal is in a steady state is that: the code stream of the upward/downward counting control signal in the steady state appears for odd times continuously.

8. The circuit of claim 4, wherein the holder (314) is a register.

9. The circuit of claim 1, wherein the first variable resistor (304) and the second variable resistor (306) are composed of multiple parallel resistors as a parallel structure, respectively, and each branch of the parallel structure respectively composing the first variable resistor (304) and the second variable resistor (306) comprises a switch and a resistor.

10. The circuit of claim 9, wherein the multiple resistors are the same multiple resistors with the resistance of R.

11. The circuit of claim 10, wherein the regulable resistances of the first variable resistor (304) and the second variable resistor (306) are R/n (n=0, 1, 2, . . . , 2N−1), n is the number of the multiple parallel resistors, and N is a positive integer.

12. The circuit of claim 9, wherein the branch is a branch formed by grouping according to binary weight.

13. The circuit of claim 9, wherein the switch is formed by using an NMOS transistor or PMOS transistor, and the resistor in the parallel structure comprises a first resistor and a second resistor; and a method for connecting the switch and the resistor in the parallel structure comprises: a source and a drain of the NMOS transistor or PMOS transistor are connected to the first resistor and the second resistor in series, respectively.

14. The circuit of claim 1, wherein the first variable resistor (304) and the second variable resistor (306) are composed of multiple series resistors, respectively.

15. The circuit of claim 1, wherein the second end of the reference resistor (302) is grounded; the second end of the first variable resistor (304) is grounded; the second variable resistor (306) as a terminating resistor is a resistor identical with the first variable resistor (304).

16. A method for performing on-chip impedance matching for a transmission line on the basis of a negative feedback circuit of claim 1, comprising:

comparing voltage across a reference resistor with voltage across a first variable resistor, and acquiring a regulating signal according to the result of the comparison;

synchronously regulating the resistances of the first variable resistor and a second variable resistor to make the resistance of the second variable resistor equal to the desired terminating resistance.

17. The method of claim 16, wherein the acquiring a regulating signal according to the result of the comparison comprises:

outputting a high level when the voltage across the first variable resistor is larger than the voltage across the reference resistor and outputting a low level when the voltage across the first variable resistor is smaller than the voltage across the reference resistor;

counting according to the outputted high level and low level and taking the result of the counting as the regulating signal; wherein upward counting is performed when the high level is output while downward counting is performed when the low level is output.

18. The method of claim 16, wherein the synchronously regulating the resistances of the first variable resistor and a second variable resistor to make the resistance of the second variable resistor equal to the desired terminating resistance comprises:

feeding back the regulating signal to a regulating end of the first variable resistor and a regulating end of the second variable resistor to synchronously regulate the resistances of the first variable resistor and the second variable resistor.

19. The method of claim 16, further comprising: holding the resistance of the second variable resistor when the voltage across the reference resistor and the voltage across the first variable resistor are equal to each other continuously.

20. An apparatus for performing on-chip impedance matching for a transmission line comprising a negative feedback circuit according to claim 1.

\* \* \* \* \*